(12) United States Patent
Young et al.

(10) Patent No.: US 6,882,234 B2
(45) Date of Patent: Apr. 19, 2005

(54) FREQUENCY ADJUSTABLE OSCILLATOR AND METHODS OF OPERATION

(75) Inventors: Alan C. Young, New South Wales (AU); James Harvey, New South Wales (AU); Terrence M. P. Percival, New South Wales (AU)

(73) Assignees: Commonwealth Scientific and Industrial Research Organisation, Campbell (AU); Mimix Broadband, Inc., Houston, TX (US)

( * ) Notice: Subject to any disclaimer, the term of this patent is extended or adjusted under 35 U.S.C. 154(b) by 0 days.

(21) Appl. No.: 10/344,154

(22) PCT Filed: Aug. 14, 2001

(86) PCT No.: PCT/AU01/00997

§ 371 (c)(1),
(2), (4) Date: May 19, 2003

(87) PCT Pub. No.: WO02/15383

PCT Pub. Date: Feb. 21, 2002

(65) Prior Publication Data

US 2004/0012452 A1 Jan. 22, 2004

(51) Int. Cl.$^7$ ................................................ H03B 5/20
(52) U.S. Cl. ................................... 331/135; 331/107 A
(58) Field of Search ............................. 331/135, 107 A, 331/116 R, 158, 177 V, 107 SL, 176; 333/231.227

(56) References Cited

U.S. PATENT DOCUMENTS

| | | | |
|---|---|---|---|
| 3,845,423 A | * 10/1974 | Scheiner | ..................... 333/212 |
| 3,866,144 A | * 2/1975 | Sawayama et al. | ...... 331/107 G |
| 4,646,034 A | 2/1987 | Chauvin et al. | ......... 331/116 R |
| 4,825,214 A | 4/1989 | Dejaegher | .................... 392/128 |
| 4,871,984 A | * 10/1989 | Laton et al. | ............ 331/107 A |
| 4,929,906 A | * 5/1990 | Voyce et al. | ................. 330/149 |
| 4,988,957 A | * 1/1991 | Thompson et al. | ...... 331/107 A |
| 5,235,293 A | * 8/1993 | Mendolia | ...................... 331/96 |
| 5,608,360 A | 3/1997 | Driscoll | .................. 331/107 A |
| 5,652,548 A | 7/1997 | Lee et al. | ...................... 331/55 |
| 5,821,833 A | * 10/1998 | Lakin | .......................... 333/187 |
| 5,854,604 A | 12/1998 | Przybysz et al. | ........... 342/175 |
| 5,926,492 A | 7/1999 | Yoshida et al. | ................. 372/6 |

FOREIGN PATENT DOCUMENTS

WO   WO 90/14709   11/1990

* cited by examiner

Primary Examiner—Robert Pascal
Assistant Examiner—Joseph Chang
(74) Attorney, Agent, or Firm—Nixon & Vanderhye P.C.

(57) ABSTRACT

An oscillator (100, 200) and a method of adjusting the frequency of oscillation of the oscillator (100, 200) are disclosed for generating a signal with an adjustable frequency in a frequency range from 1 GHZ to 200 GHz. The oscillator (100, 200) includes a loop circuit. The loop circuit has an amplifier (101), a delay element or filter (103), a phase shifter (102), a device for adjusting the phase shifter (102), and a coupler (104) to provide an output signal. The adjusting device is coupled to the phase shifter (102).

27 Claims, 4 Drawing Sheets under the US 6,882,234 B2

FREQUENCY ADJUSTABLE OSCILLATOR AND METHODS OF OPERATION

This application is the U.S. national phase of international application PCT/AU01/00997, filed Aug. 14, 2001, which designated the U.S. and claims the priority benefit of Australian application PQ 9455, filed Aug. 15, 2000, the entire contents of which are hereby incorporated by reference.

TECHNICAL FIELD

The present invention relates generally to electronic oscillators and, in particular, an electronic oscillator adjustable in a frequency range from 1 GHz to 200 GHz, a method of adjusting the frequency of oscillation of the oscillator, and a method of providing an output signal of a required frequency from the oscillator.

BACKGROUND

Radio frequency signals are typically generated using electronic circuits called oscillators, which convert DC electrical energy into a signal of the required frequency.

The form of an oscillator is generally a gain block with some form of frequency selective feedback, such as a tuned circuit or resonator, arranged such that a self-sustaining signal is maintained by the feedback loop. There is another class of oscillator commonly used at radio frequencies, which uses a negative impedance to generate the oscillation. In both cases, to achieve good performance, a resonator with a high quality factor (Q factor) is desirable. The Q of a circuit is its centre frequency divided by the resonator 3 dB bandwidth.

A general reference on microwave and millimeter wave oscillators giving detailed explanations of this can be found in Randall W. Rhea, *Oscillator Design and Computer Simulation*, Noble Publishing, Atlanta, 1995 (ISBN 1-884932-30-4), pp. 1–87.

In some cases mechanical tuning of the frequency of oscillation is acceptable. However, in many applications it is desirable to be able to electronically set and/or modulate the frequency of the oscillator. This is achieved by placing an electronic component such as a varactor diode (or similar device having characteristics that can be electronically controlled) as one element of the resonant circuit. This has the disadvantage that the varactor diode limits the tuning range (compared to that of a mechanically tuned oscillator), gives a non-uniform frequency versus control signal characteristic, limits the magnitude of the oscillating signal, is difficult to integrate and is itself a source of electrical noise. In some applications, the overall tuning range is desirably increased by using a combination of electrical tuning (for fine adjustment) and mechanical tuning (for coarse adjustment).

The phase slope versus frequency characteristic of the resonator defines the phase noise and stability of the feedback oscillator. This is related to the Q factor of the resonator, and for a single pole resonator the average slope is 90 degrees over the 3 dB bandwidth, which equals filter centre frequency divided by filter Q. To obtain higher Q (hence lower noise), the bandwidth needs to be decreased. As described above, many oscillators use a varactor diode to allow the resonator frequency to be adjusted. This limits the obtainable Q and tuning range.

Optimal phase noise performance for any given resonator occurs at the frequency for which the resonator has the highest phase slope. An additional phase shift may be introduced into the feedback path, to ensure that the optimum frequency of operation is obtained, ie. ensuring that the conditions for oscillation are obtained at the frequency for which the resonator has the highest phase slope. In single pole resonators there is only one optimum point of operation (over a narrow band). This optimum setting has to be obtained by manual adjustment or by calculation.

A method for obtaining high phase slope over a wide bandwidth is advantageous. For example, for a multi-section filter, the phase slope increases with the number of sections of the filter and the phase slope is linear over an extended frequency range. Therefore, it is possible to achieve wider tuning range for a given phase slope without changing the filter. However it is then necessary to introduce a controlled phase shift in the feedback loop to adjust the overall loop phase shift to be a multiple of 360 degrees at the required operating frequency.

The open loop gain must exceed unity. This is achieved by adjusting the gain within the loop (e.g. with a variable attenuator) and/or allowing the amplifiers to compress.

In recent years monolithic microwave integrated circuits (MMICs) have been developed to reduce the cost of microwave and millimeter wave active circuits. Further information can be found in "New Developments in the Design of Microwave and Millimeter-wave Oscillators", Institute of Electrical and Electronics Engineers—Microwave Theory and Techniques Special, Vol. 46, No. 10, October 1998, Part 2. One disadvantage of MMICs is the difficulty of connecting a negative resistance oscillator to the external circuit required to meet the desired quality factor. Alternatively, an (integrated) on-chip resonator can be used, however, these have low Q factors and limited tuning range.

One application of a microwave and millimeter wave oscillator is as the source of a signal to carry information. Any noise or unwanted perturbation of the frequency of the signal results in a reduction in the information carrying capacity of the signal.

Thus, there is a need for a low noise frequency adjustable oscillator the frequency of which oscillator is adjustable in a frequency range from 1 GHz to 200 GHz.

SUMMARY

In accordance with a first aspect of the invention, an oscillator is provided for generating a signal with an adjustable frequency in a frequency range from 1 GHz to 200 GHz. The oscillator includes a loop circuit having:
  an amplifier;
  a delay element or filter;
  a phase shifter;
  means for adjusting the phase of the phase shifter, the adjusting means being coupled to the phase shifter; and
  means for providing an output signal.

In accordance with a second aspect of the invention, a method is provided for adjusting the frequency of oscillation of an output signal from an oscillator, operating in a frequency range from 1 GHz to 200 GHz. The method includes the steps of:
  providing the oscillator including a loop circuit having:
  an amplifier;
  a delay element or filter;
  a phase shifter;
  means for adjusting the phase shifter to provide an unlimited range of phase shift adjustment, the adjusting means being coupled to the phase shifter; and means for providing the output signal;

adjusting a phase shift of the phase shifter to adjust the frequency of oscillation of the oscillator to a required frequency.

In accordance with a third aspect of the invention, a method is disclosed for providing an output signal of a required frequency from an oscillator, the output signal being adjustable in a frequency range from 1 GHz to 200 GHz. The method includes the steps of:

providing the oscillator including a loop circuit having:

an amplifier;

a delay element or filter;

a phase shifter;

means for adjusting the phase shifter to provide an unlimited range of phase shift adjustment, the adjusting means being coupled to the phase shifter; and means for providing the output signal; and adjusting a phase shift of the phase shifter so as to adjust a frequency of the output signal to a required frequency.

BRIEF DESCRIPTION OF DRAWINGS

A small number of embodiments of the invention are described hereinafter with reference to the drawings, in which.

DETAILED DESCRIPTION

Figure 1:
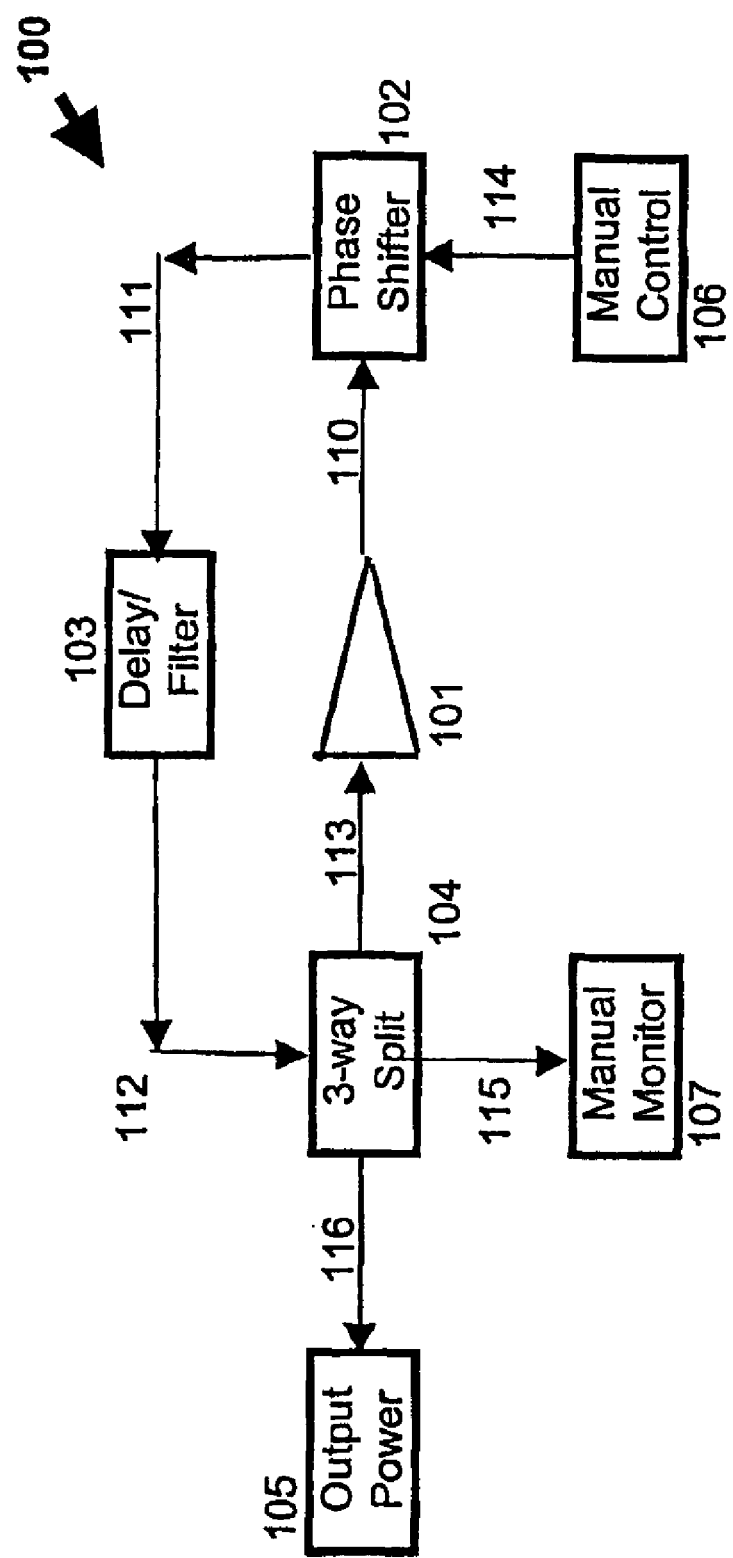
FIG. 1 is a schematic diagram of an oscillator circuit 100 according to one embodiment of the invention.

An adjustable oscillator operable in the radiofrequency to millimeter bandwidths and methods of adjusting the frequency of the oscillator and providing corresponding output signals are disclosed. In the following description, numerous details are set forth. However, it will be apparent to those skilled in the art that changes and/or modifications can be made without departing from the scope and spirit of the invention.

The embodiments of the invention concern radio frequency, microwave and millimeter wave systems and the generation of signals at these wavelengths, and have particular (but not exclusive) application to the fields of radiofrequency, microwave and millimeter radio communications. In the embodiments of the invention, an oscillator is used that may be a microwave oscillator, a radiofrequency oscillator, a millimeter oscillator, or a combination thereof. Further, the oscillator may be a microwave oscillator, a radiofrequency oscillator, or a millimeter oscillator operating within a microwave frequency band within the microwave bandwidth, a radiofrequency band within the radiofrequency bandwidth, or a millimeter frequency band within the millimeter bandwidth, respectively.

An oscillator is described hereinafter for generating a signal with an adjustable frequency in a frequency range from 1 GHz to 200 GHz. The oscillator includes a loop circuit having an amplifier, a delay element or filter, a phase shifter, a circuit or device for adjusting the phase of the phase shifter, and a coupler to provide an output signal. The adjusting circuit is coupled to the phase shifter, and the coupler is coupled to or forms part of the oscillator. A method is also described of adjusting the frequency of oscillation of an output signal from an oscillator, operating in a frequency range from 1 GHz to 200 GHz. In this method, the oscillator is provided that includes a loop circuit having an amplifier, a delay element or filter, a phase shifter, a circuit for adjusting the phase shifter to provide an unlimited range of phase shift adjustment, and a coupler to provide the output signal. The adjusting device is coupled to the phase shifter. The method includes the step of adjusting the phase shift of the phase shifter to adjust the frequency of oscillation of the oscillator to the required frequency. A further method is disclosed of providing an output signal of a required frequency from an oscillator with the output signal being adjustable in a frequency range from 1 GHz to 200 GHz. In this method, an oscillator is provided that includes a loop circuit having an amplifier, a delay element or filter, a phase shifter, a circuit for adjusting the phase shifter to provide an unlimited range of phase shift adjustment, and a coupler to provide the output signal the coupler being coupled to the circuit. The adjusting circuit is coupled to the phase shifter. The method includes the steps of adjusting the phase shift of the phase shifter to adjust the frequency of the output signal to the required frequency.

Broadly speaking, the loop circuit includes an oscillator based on a gain block and a feedback path. The feedback path contains a phase shifter and a delay element or bandpass filter. Preferably, the phase shifter includes a vector modulator to provide an unlimited range of phase shift adjustment. Examples of suitable vector modulators are disclosed in Ashtiani, Ali E, et al, "Direct Multilevel Carrier Modulation Using Millimeter—Wave Balanced Vector Modulator", IEEE Transactions on Microwave Theory and Techniques, Vol. 46, No. 12, December 1998, pp. 2611–2619, the contents of which are incorporated herein by cross reference. The adjusting circuit is typically electronically controllable. The method typically includes electronically adjusting the phase shift of the vector modulator.

It is particularly advantageous to control the phase shifter electronically. The phase shift of the phase shifter can be controlled electronically to change the frequency of oscillation and thereby the frequency of the output signal from the oscillator. For reduced cost, the phase shifter and gain block may be implemented in MMICs. A vector modulator as the phase shifter is preferable and has the advantage over conventional phase shifters that the phase shift can be continually varied over an arbitrary number of 360 degree rotations. This allows the operating frequency of the oscillator to be continuously tuned (electronically) over the full passband of the delay element or bandpass filter, e.g. the full passband of a filter.

Using MMIC technology also allows the active circuitry to have a much wider operating frequency range than a given filter. The operating range of the oscillator can be altered by substituting a different filter. Typically the filter is chosen so that the oscillator operates within a frequency range selected from the group consisting of radiofrequency range, microwave range, millimeter range and combinations thereof.

The delay element or bandpass filter is typically a multi-section filter such as a multi-resonator filter or a transmission line. The multi-section filter bandpass characteristic may be fixed or electronically controlled. The resonator may be a high Q device, such as a stripline or a waveguide filter. In the latter case, the passband of the waveguide filter can be adjusted mechanically to change the tuning range. Alternatively, if a yttrium iron garnet (YIG) tuned filter is used, its passband may be adjusted electronically.

The coupler may be coupled at any point in the loop circuit.

The oscillator can be phase and/or frequency locked to a reference signal using a frequency divider (or harmonic mixer) on the output signal to generate a signal that can be compared to the reference signal. The difference is used to control the phase shifter and hence lock the signal. Thus, the oscillator may further include a comparator coupled to the loop circuit, such as by being coupled to the coupler in the loop circuit, and the vector modulator to compare the frequency of a signal in the loop circuit with the frequency of a reference signal. A first output (coarse) phase adjusting signal is provided by the comparator to the vector modulator. The first output phase adjusting signal usually includes two signals: an in-phase signal and a quadrature signal. The comparator may further provide a second output (fine) phase adjusting signal to adjust the phase shift of the loop, in which case the comparator is also coupled to a limited range continuous phase shifter in the loop. The second output (fine) phase control may be achieved by varying the amplifier bias, which varies the amplifier phase response or by alternative implementation of an additional limited-range phase shifter. In particular, the comparator may include a phase-locked loop circuit providing phase-locked loop control that can include frequency and/or phase locking to a reference signal by the use of standard phase-locked loop techniques. Examples of this include Gardner, F. M., *Phaselock Techniques*, Wiley, New York, 1967, pp. 7–77, the contents of which are incorporated by cross reference.

Characteristics of oscillators according to the invention include one or more of wide tuning range, high output power, low phase noise, linear tuning and low cost.

FIG. 1 is a block diagram depicting an adjustable oscillator in accordance with an embodiment. The oscillator includes a loop circuit 100 having an amplifier 101 having an input and output, a continuous phase shifter 102 having an input, an output and a controller input 114, a delay element or bandpass filter 103 having an input and output, and a 3-way split coupler 104 having an input and three outputs. The output of the amplifier 101 is linked to the input of the phase shifter 102 by line 110. The input of the delay element or bandpass filter 103 is linked to the output of the phase shifter 102 by line 111. The input of 3 way split coupler 104 is linked to the output of filter 103 by line 112. One of the outputs of coupler 104 provides output power 105 via line 116, another output of coupler 104 is linked to the input of amplifier 101 by line 113, and a third output of coupler 104 is linked to a monitor 107 (such as a spectrum analyzer or frequency meter), if required, by line 115. A controller 106 is linked to phase shifter 102 by line 114 to adjust the phase shifter 102 to provide an unlimited range of phase shift adjustment. Amplifier 101, phase shifter 102 and filter 103 may be linked together in a number of different configurations to form the loop circuit 100 without departing from the scope and spirit of the invention. Coupler 104 may be linked to the loop circuit 100 at any point in the loop circuit to provide output power 105.

In use, DC power is applied to the loop 100 and the frequency at the output power 105 is adjusted by manually adjusting the phase shift of the phase shifter 102 via controller 106.

When DC power is applied to the circuit of FIG. 1, the circuit may or may not be in a state where the total delay in the loop 100 is an integer multiple of cycles at a frequency within the band-pass of the delay element or bandpass filter 103. If the condition is met, the circuit oscillates; otherwise, the circuit 100 does not oscillate. The signal is observed at the monitor port on line 115, and the phase of the phase shifter 102 is increased until a signal is observed. Further increase in phase shift causes the frequency of oscillation to vary, and the phase can then be adjusted until the frequency of oscillation is at the desired value.

As the phase is increased further, at some point the oscillation ceases, but re-commences after a further increase in phase. The frequency also jumps from one end of the range set by the bandpass of the delay element or bandpass filter 103 to a frequency near the other end. It may be necessary to decrease the phase to achieve the required frequency. In all of the above, the sense may be reversed, ie. operation may be commenced by decreasing the phase shift after power is applied. Once the required frequency is approached, the frequency may be finely and continuously adjusted by increasing or decreasing the phase of the phase shifter. The sense of adjustment is determined by the sense of the phase slope of the delay element or bandpass filter 103.

Figure 2:
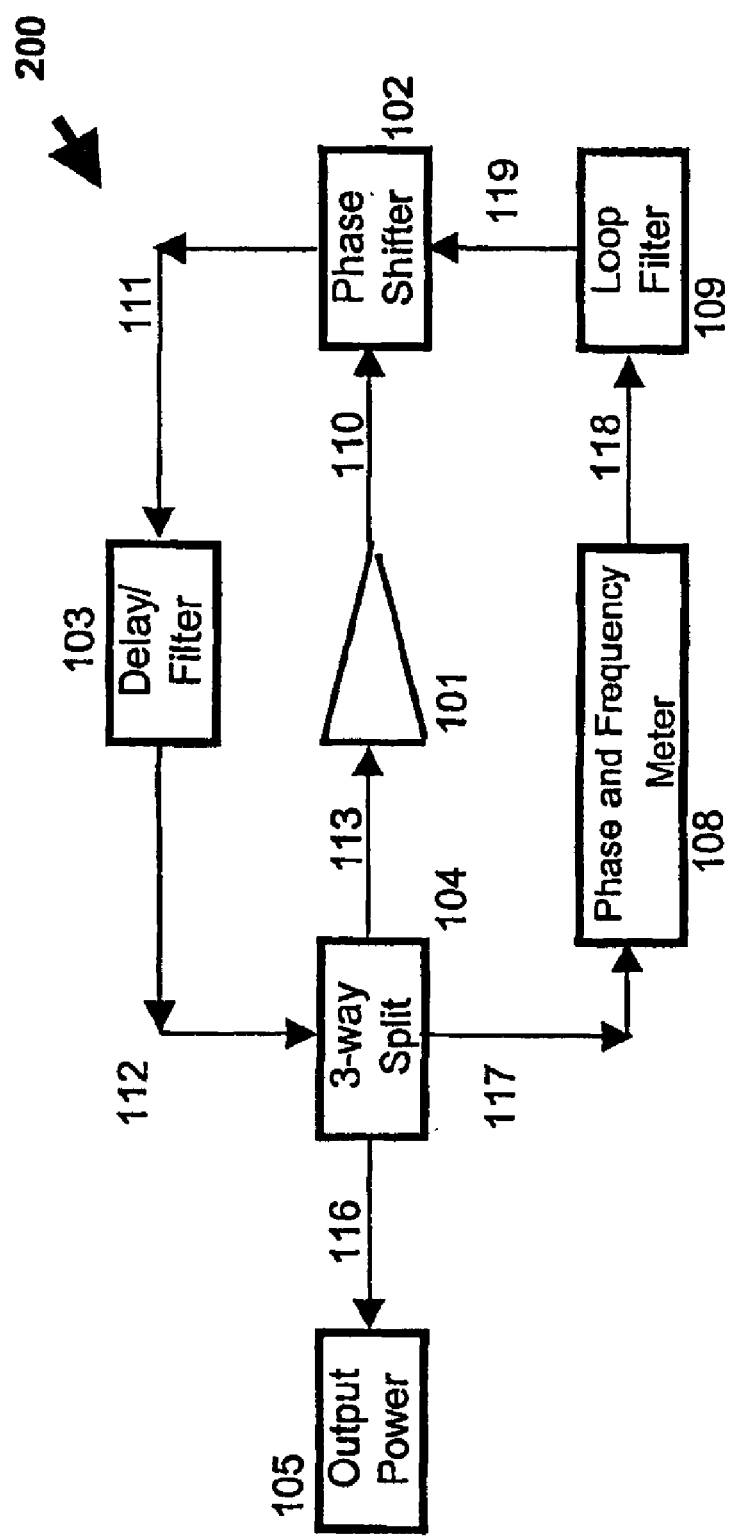
FIG. 2 is a schematic diagram of an oscillator circuit 200 according to another embodiment of the invention, which includes a phase-locked loop.

FIG. 2 depicts an oscillator including a loop circuit 200 having the same components 101, 102, 103, 104 in the loop as FIG. 1. However, in this circuit 200 according to a second embodiment, the monitor 107, line 115, controller 106 and line 114 are replaced by a feedback path, comprising a phase and frequency meter 108 connected to the splitter 104 by line 117 and an output connected via line 118 (phase error) to loop filter 109 and thence by control line 119 to the phase shifter 102.

In use, the circuit 200 of FIG. 2 is stabilised by measuring its frequency and/or phase using phase and frequency meter 108, applying standard phase locked loop techniques. This is performed by sampling the output from the coupler 104 via line 117 and comparing the output to a frequency reference in the phase and frequency meter 108. The resulting error signal is sent to loop filter 109, via line 118. The loop filter output 119 controls the phase shift of the phase shifter 102 to obtain the required frequency and/or phase in loop circuit 200.

Figure 3:
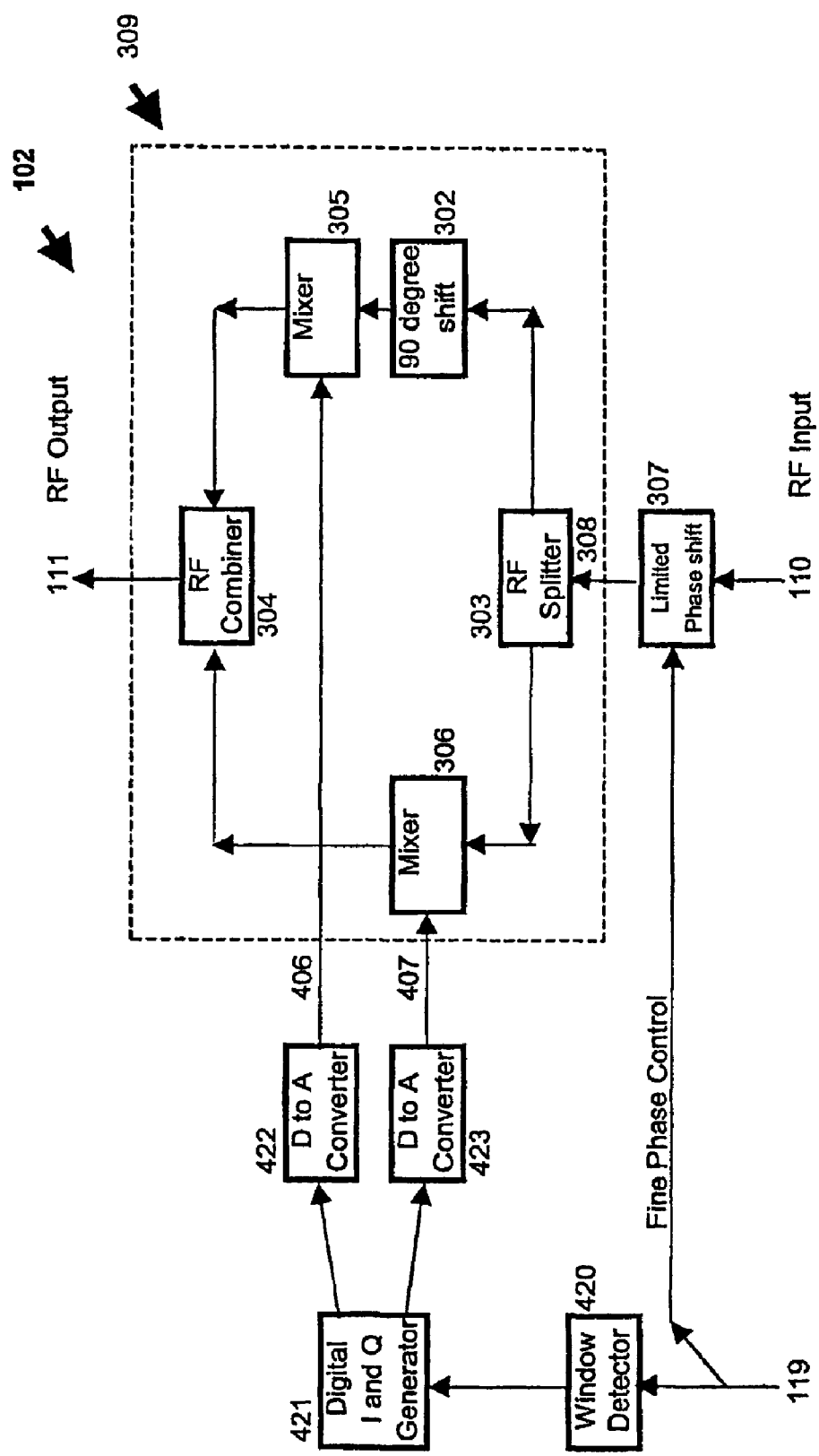
FIG. 3 is a schematic diagram of a phase shifter used in the embodiments depicted in FIGS. 1 and 2.

One particular implementation of a continuous phase shifter is a vector modulator, referred to above. FIG. 3 is a block diagram of a phase shifter 102. This contains a vector modulator 309 and a limited range continuous phase shifter 307. These components in conjunction with control circuits shown in FIG. 4 may be used to implement the phase shifter 102 of FIGS. 1 and 2. The vector modulator 309 has an RF input 308 and an RF output 111. The input signal 308 is split into two equal power signals by a splitter 303, and one of the signals is shifted by 90 degrees by a phase shifter 302. The input signal and phase-shifted input signal are then fed to two mixers 306, 305, respectively, and the outputs of the mixers 305, 306 combined in RF combiner 304, with no relative delay, to provide output signal 111. In this configuration, the vector modulator 309 is controlled by an in-phase signal 407 via the mixer 306 and an in-quadrature signal 406 via mixer 305, which in-phase and quadrature signals are preferably the sine and cosine of the required phase shift through the vector modulator 309.

The signal 119 provides a fine phase control signal to the phase shifter 307, which also receives RF input signal 110. The signal 119 is also provided to a window detector 420, before the detector 420 output is provided to digital I and Q generator 421. The outputs of generator 421 are provided to respective digital-to-analogue converters 422 and 423 to produce in-phase and in-quadrature signals 406, 407.

Other implementations of vector modulators or phase shifters that give multiple 360 degree ranges can be used.

Each mixer can ideally multiply its input signal by values from −1 to +1 depending on the control signal. In practice such mixers may have a gain that is not unity. By adding the outputs of two such mixers fed with signals in quadrature (ie 90 degrees relative phase shift between the signals) any desired phase can be obtained.

Figure 4:
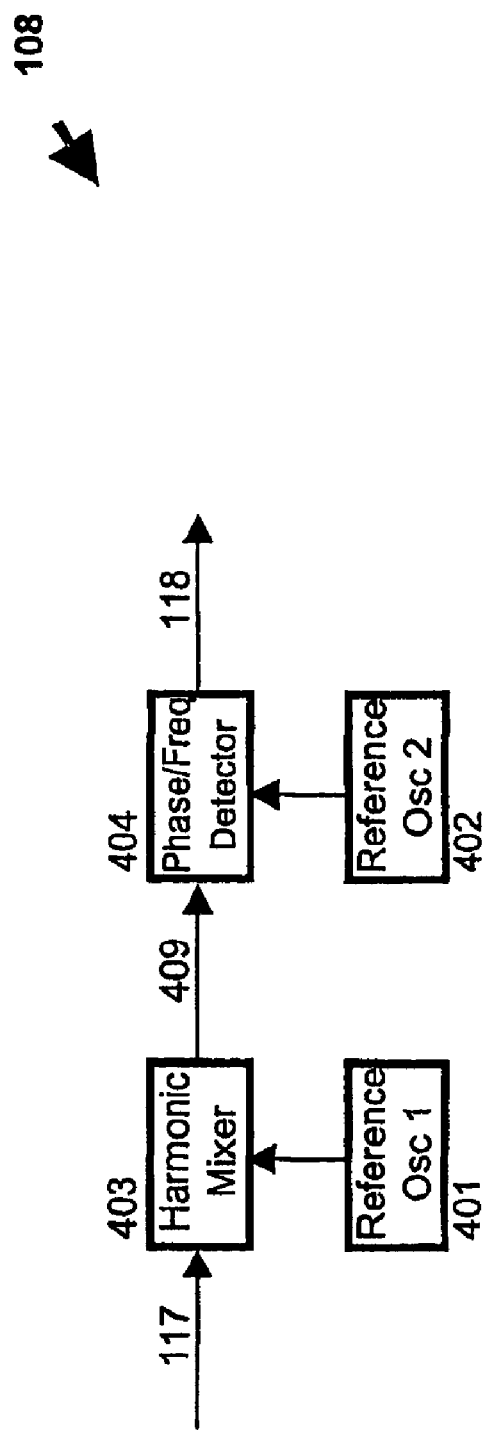
FIG. 4 is a schematic diagram of phase locked loop control circuitry used in relation to FIG. 2.

FIG. 4 depicts schematically details of a circuit suitable for use as the phase and frequency meter 108. In this implementation, the sample of the oscillator signal 117 is mixed down to a low frequency 409 by a harmonic mixer 403, which is pumped by a reference frequency 401. Another reference frequency 402 is compared with the low frequency sample 409 in a phase/frequency detector 404, having an output that is a phase and frequency error signal 118.

The error signal 118 is passed through the loop filter 109 in FIG. 2 to generate the control signal 119, which is compared to two thresholds in the window detector 420 of FIG. 3. When the error is outside the upper or lower thresholds, the value of the required phase is increased or decreased, with no action when the error signal is between the upper and lower thresholds. The digital I and Q generator 421 of FIG. 3 can be implemented using a microprocessor and generates digital values for sine and cosine of the control angle, which are passed to digital-to-analogue converters 422 and 423 to generate the I and Q control signals 406 and 407. The digital implementation creates quantisation in the resulting phase rotation.

As continuous control is required, a separate linear analogue phase shifter is typically used. This however operates over a small phase range (typically less than 10 degrees). When the error 119 is between the thresholds, the digital value for vector modulator phase is not adjusted, and the error signal 119 is used directly to make fine adjustments to the phase. This maybe done by adjusting the bias on an amplifier 101 in the loop shown in FIG. 2 or by means of a small range continuous phase shifter that may be implemented by other (well known) means, eg a low pass filter with varactor diode control of transmission phase.

Other implementations of limited range phase shifters can equally well be used. Alternatively, the use of dithering techniques to smooth the output of the digital to analogue converters can eliminate the need for the continuous linear analogue phase shifter.

The ability to continuously rotate the phase in the loop is needed to assure oscillation startup and the ability to tune the frequency of oscillation to any part of the filter pass band. Readily constructed vector modulators may exhibit varying slope or even non monotonic phase versus control increment, due to reflections from internal mixer elements.

The range of the continuous shifter must exceed the step size of the discrete phase shifter by some margin, to allow for overshoot and non-monotonicity. The phase could go in the wrong direction initially and be tracked by the continuous phase shifter, providing the rate of change in vector modulator induced phase shift is slow relative to the ability of the continuous shifter to compensate. As loop bandwidth of the continuous loop is generally desired to be high, this should not be a problem. It is unnecessary to ensure that the vector modulator is not triggered to change twice within the transition event, assuming the loop was locked initially, provided the range of the continuous phase shifter is sufficient to accommodate the largest step change. A key advantage of this approach is that the dynamics of the loop are related to the gain of the continuous phase shifter, which remains constant, relative to the larger gain variation in typical vector modulators.

The electronic circuit for converting the error to the sine and cosine control signals can take the form of a look-up table or a computation such as a cordic processor or using a programmable microcomputer. This conversion to sine and cosine may be done using a continuous analog means, thus removing the need for the additional fine control.

The Q factor and hence stability and spectral purity of the oscillator is determined by the delay element or bandpass filter 103, as it is related to the slope of the phase versus frequency characteristic. For single section bandpass filters, high Q is obtained at the expense of narrow bandwidth. In the circuit of FIGS. 1 and 2, a multi-section filter 103 is used to maintain high Q with wider electrical tuning range.

Other implementations may use single section filters with a unique single phase and amplitude value required to achieve optimum performance, and a narrow range of values for which it will oscillate.

The oscillators of FIGS. 1 and 2 can be constructed using active components with wide (greater than an octave) bandwidth, but with the electrical tuning range of a particular oscillator defined by the bandwidth of the chosen filter. One set of active components can then be used for a wide variety of frequencies by using different filters. This results in lower operational and manufacturing costs. For example in one implementation, an oscillator with an electronic tuning range of 300 MHz was built. By replacing only the bandpass filter the same circuit worked over the range from 18 GHz to 26 GHz.

No manual alignment in the oscillator of FIG. 2 is required, as the phase and frequency meter 108 finds the optimum operating point automatically. (i.e. the resonator does not have to be tuned to a particular frequency provided its passband includes the required frequency).

Another advantage of the oscillator described above is that the oscillator can operate at higher output power, as there is no varactor whose operation is affected at high signal levels. The amplifier also provides the required limiting function.

An oscillator for generating a signal with an adjustable frequency from 1 GHz to 200 GHz, a method of adjusting the frequency of oscillation of an output signal from an oscillator, and a method of providing an output signal of a required frequency from an oscillator have been described. It will be apparent to those skilled in the art, in the light of this disclosure, that modifications and/or changes can be made to the embodiments described without departing from the scope and spirit of the invention.

We claim:

1. An oscillator for generating a signal with an adjustable frequency in a frequency range of radio frequency (RF), microwave, and millimeter wave frequencies, said oscillator including:
   a loop circuit having:
      an amplifier or gain block;
      a delay element or filter;
      a phase shifter including a vector modulator to provide an unlimited range of phase shift adjustment;
      means for adjusting the phase of said phase shifter, said adjusting means being coupled to said phase shifter; and
      means for providing an output signal.

2. The oscillator according to claim 1, for use in the frequency range from 1 GHz to 200 GHz.

3. The oscillator according to claim 1, wherein said loop circuit has a feedback path including said phase shifter and said delay element or filter.

4. The oscillator according to claim 3, wherein said filter is a bandpass filter.

5. The oscillator according to claim 3, wherein said phase shifter and said gain block are implemented in MMICs.

6. The oscillator according to claim 1, wherein said adjusting means is electronically controllable.

7. The oscillator according to claim 6, wherein said electronically controllable adjustment is effected by adjusting the phase shift of said vector modulator.

8. The oscillator according to claim 1, wherein said delay element or filter is a multi-section bandpass filter, the multi-section filter bandpass characteristic being fixed or electronically controlled.

9. The oscillator according to claim 8, wherein said multi-section bandpass filter is a multi-resonator filter.

10. The oscillator according to claim 9, wherein the resonator is a high Q device, including a stripline or waveguide filter.

11. The oscillator according to claim 10, wherein a passband of said waveguide filter is mechanically adjustable to change a tuning range.

12. The oscillator according to claim 11, further including a yttrium iron garnet (YIG) tuned filter, a passband of said filter being electronically adjustable.

13. The oscillator according to claim 1, wherein said means for providing an output signal is located at any point in said loop circuit, wherein said providing means is a power splitter or a coupler.

14. The oscillator according to claim 3, further including:
a frequency divider (or harmonic mixer) operating on said output signal; and
a comparator coupled to said loop circuit and said vector modulator to compare a frequency of a signal in said loop circuit with the frequency of a reference signal, a difference in said frequencies used to control said phase shifter.

15. The oscillator according to claim 14, wherein said comparator provides a first output (coarse) phase adjusting signal to said vector modulator and a second output (fine) phase adjusting signal to adjust the phase shift of said loop.

16. The oscillator according to claim 15, wherein said first output phase adjusting signal includes an in-phase signal and a quadrature signal.

17. The oscillator according to claim 14, wherein said comparator includes a phase-locked loop circuit providing phase-locked loop control which can include frequency and/or phase locking to a reference signal.

18. A method of adjusting the frequency of oscillation of an output signal from an oscillator, operating in a frequency range of radio frequency (RF), microwave, and millimeter wave frequencies, said method including the steps of:
providing said oscillator including a loop circuit having:
an amplifier or gain block;
a delay element or filter;
a phase shifter including a vector modulator to provide an unlimited range of phase shift adjustment;
means for adjusting said phase shifter, said adjusting means being coupled to said phase shifter; and
means for providing said output signal;
adjusting a phase shift of said phase shifter to adjust the frequency of oscillation of said oscillator to a required frequency.

19. The method according to claim 18, for use in the frequency range from 1 GHz to 200 GHz.

20. A method of providing an output signal of a required frequency from an oscillator, said output signal being adjustable in a frequency range of radio frequency (RF), microwave, and millimeter wave frequencies, said method including the steps of:
providing said oscillator including a loop circuit having:
an amplifier or gain block;
a delay element or filter;
a phase shifter including a vector modulator to provide an unlimited range of phase shift adjustment;
means for adjusting said phase shifter, said adjusting means being coupled to said phase shifter; and
means for providing the output signal; and
adjusting a phase shift of said phase shifter so as to adjust a frequency of said output signal to a required frequency.

21. The method according to claim 18, for use in the frequency range from 1 GHz to 200 GHZ.

22. An oscillator for generating a signal with an adjustable frequency in a frequency range of radio frequency (RF), microwave, and millimeter wave frequencies, said oscillator including:
a loop circuit having:
an amplifier or gain block;
a delay element or filter;
a phase shifter including a vector modulator providing an unlimited range of phase shift adjustment, said delay element or filter and said phase shifter contained in a feedback path of said loop circuit;
a power splitter or coupler to provide an output signal; and
a controller coupled to said phase shifter to adjust the phase of said phase shifter.

23. The oscillator according to claim 22, wherein said power splitter or coupler is a three-way split coupler.

24. The oscillator according to claim 22, for use in the frequency range from 1 GHz to 200 GHz.

25. An oscillator for generating a signal with an adjustable frequency in a frequency range of radio frequency (RE), microwave, and millimeter wave frequencies, said oscillator including:
a loop circuit having:
an amplifier or gain block;
a delay element or filter;
a phase shifter including a vector modulator providing an unlimited range of phase shift adjustment, said delay element or filter and said phase shifter contained in a feedback path of said loop circuit;
a power splitter or coupler to provide an output signal; and
a phase and frequency meter and a loop filter coupled to said phase shifter to adjust the phase of said phase shifter.

26. The oscillator according to claim 25, wherein said power splitter or coupler is a three-way split coupler.

27. The oscillator according to claim 25, for use in the frequency range from 1 GHz to 200 GHz.

* * * * *